US006545338B1

(12) United States Patent
Bothra et al.

(10) Patent No.: US 6,545,338 B1
(45) Date of Patent: Apr. 8, 2003

(54) METHODS FOR IMPLEMENTING CO-AXIAL INTERCONNECT LINES IN A CMOS PROCESS FOR HIGH SPEED RF AND MICROWAVE APPLICATIONS

(75) Inventors: Subhas Bothra, Fremont, CA (US); Calvin Todd Gabriel, Cupertino, CA (US); Michael Misheloff, Dublin, CA (US); Milind Weling, San Jose, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/429,586

(22) Filed: Oct. 28, 1999

(51) Int. Cl.⁷ .............................................. H01L 29/00
(52) U.S. Cl. ........................ 257/508; 257/787; 257/659
(58) Field of Search ................................. 257/508, 987, 257/659, 663, 662, 506, 369, 758, 759, 760, 761, 762, 763, 764, 765, 766, 664; 438/200

(56) References Cited

U.S. PATENT DOCUMENTS

| | | | |
|---|---|---|---|
| 5,363,550 A | | 11/1994 | Aitken et al. |
| 5,652,557 A | | 7/1997 | Ishikawa |
| 5,665,644 A | | 9/1997 | Sandhu et al. |
| 5,729,047 A | | 3/1998 | Ma |
| 5,811,882 A | * | 9/1998 | Latham, IV et al. ......... 257/776 |
| 6,091,150 A | * | 7/2000 | Sandu et al. ................. 257/758 |
| 6,242,796 B1 | * | 6/2001 | Sim et al. .................... 257/664 |
| 6,310,386 B1 | * | 10/2001 | Shenoy ........................ 257/531 |
| 6,348,718 B1 | * | 2/2002 | Leipold et al. .............. 257/379 |

FOREIGN PATENT DOCUMENTS

| | | |
|---|---|---|
| GB | 2 277 832 | 11/1994 |
| JP | 61096781 | 5/1986 |
| JP | 61096782 | 5/1986 |
| JP | 01290238 | 11/1989 |

OTHER PUBLICATIONS

Lee, CMOS RF: No longer an oxymoron. 1997 IEEE, pp. 244–247.*
Lee, CMOS RF: (Still) No Longer an Oxymoron (Invited). 1999 IEEE, pp 3–6.*
Thomas et al., VLSI Multilevel Micro–Coaxial Interconnects for High Speed Devices. 1990 IEEE, pp. 3.5.1–3.5.4.*

* cited by examiner

Primary Examiner—Tom Thomas
Assistant Examiner—Douglas W. Owens
(74) Attorney, Agent, or Firm—Peter Zawilski

(57) ABSTRACT

A method for making a semiconductor device with integrated CMOS circuitry and RF circuitry fabricated over a semiconductor wafer, and a semiconductor device with integrated CMOS circuitry and RF circuitry fabricated over a semiconductor wafer is provided. The method includes forming a lower metallization layer and a lower dielectric layer over the lower metallization layer. A metallization line is formed over the lower dielectric layer with an upper dielectric layer over the metallization line. An upper metallization layer is then formed over the upper dielectric layer. After this is completed, oxide spacers are formed along the sides of the lower dielectric layer, the metallization line, and the upper dielectric layer. Finally, an encapsulating metallization layer is formed over the oxide spacers such that the lower metallization layer, the upper metallization layer and the encapsulating metallization layer define an outer shield and the metallization line defines an inner conductor of an RF line.

5 Claims, 9 Drawing Sheets

METHODS FOR IMPLEMENTING CO-AXIAL INTERCONNECT LINES IN A CMOS PROCESS FOR HIGH SPEED RF AND MICROWAVE APPLICATIONS

CROSS REFERENCE TO RELATED APPLICATIONS

This application is related to the following U.S. patent application entitled "Methods for Forming Co-Axial Interconnect Lines in a CMOS Process for High Speed Applications," having U.S. patent application Ser. No. 0/429,540, filed on the same day as the instant application. This application is hereby incorporated by reference.

BACKGROUND OF THE INVENTION

1. Field of the Invention

The present invention relates to the manufacture of semiconductor devices. More particularly, the present invention relates to the integration of radio frequency (RF) devices and RF features and microwave devices and microwave features into standard complementary metal oxide semiconductor (CMOS) chips.

2. Description of the Related Art

Today's semiconductor devices are continually being pushed to meet stricter demands. As devices using this technology inundate the marketplace, consumers place higher demands on the devices. These demands include smaller, more compact devices with greater functionality.

In order to meet the demands, semiconductor devices employ CMOS chips and RF chips. Such devices include, for example, cellular phones that require both digital CMOS circuitry as well as RF circuitry to enable wireless communication. Conventionally, in order to integrate both digital CMOS and RF circuitry onto one chip, manufacturers have been forced to use co-axial interconnect lines to handle the RF signals.

In addition, the use of a co-axial interconnect line presents other problems. FIGS. 1A and 1B represent a cross-sectional view and a top view, respectively, of a prior art interconnect structure 12 having a suspended portion 14 over a silicon substrate 10. Interconnect structure 12 includes an inner conductor 20, an insulating dielectric coating 18 and an outer conductive layer that serves to encapsulate the insulating dielectric coating 18. Interconnect structure 12 also includes two contact posts 13 fabricated that have a larger dimension so as to support suspended portion 14.

It should be noted that the suspended portion 14 tends to sag under the influence of gravity. Therefore, there is a limit to the length of such structures before they fracture and break, which is a significant practical problem in implementing this prior art structure. Another problem encountered with the interconnect structure of FIG. 1A is the inability to stack multiple interconnect layers. By way of example, if a second interconnect structure were built over structure 12, the probability of breaking center region 14 dramatically increases due to the lack of mechanical support under center region 14. For a more detailed description of the steps associated with fabricating this prior art interconnect structure, reference may be made to a paper entitled "VLSI Multilevel Micro-Coaxial Interconnects for High Speed Devices" by M. E. Thomas, et al., Fairchild Research Center, National Semiconductor Corporation, Santa Clara, Calif., IEDM Tech. Dig., pages 55–58. (1990), which is hereby incorporated by reference.

Another drawback of integrating RF circuitry into chips that are primarily designed for digital CMOS circuits is co-axial lines 12 must be integrated at the top-most metallization level of a chip. This presents significant limitations in the number of RF lines that can be used to complete RF signal processing for a given chip. Therefore, designers wanting to integrate RF lines over predominately CMOS chips must design the chip substantially larger to enable the desired number of RF lines to appropriately be integrated to the top metal layer of the chip. This limitation is well known to circuit designers, and therefore, it is often determined to be more advantageous to use separate chips for CMOS circuitry and RF circuitry.

As shown in FIG. 1C, designers of cellular phones typically find it more practical to use a CMOS chip 52 for performing digital signal processing and a separate RF circuit 55 to process RF signals. This is commonly preferred due to the limitations of trying to integrate RF lines onto chips that are custom fabricated for CMOS digital processing. Nonetheless, an arrangement of this sort presents problems, among them fabrication costs, power losses, signal losses and additional packaging complexities. Circuit 50 requires that RF circuit 55 and the CMOS chip 52 be individually fabricated and integrated onto the printed circuit board (PCB) 51. This increases manufacturing costs and manufacturing time.

As signals are communicated back and forth from RF circuit 55 and CMOS chip 52, signal loss will naturally occur. Henceforth, this signal loss reduces overall efficiency of a circuit implementation needing both digital CMOS and RF circuitry. In order to overcome these losses, signal conditioning may be necessary to improve signal integrity. However, the use of such devices will aggravate the problem of packaging that already exists with the prior art.

Packaging inefficiencies of the prior art circuit using RF circuit 55 and CMOS chip 52 make this type of circuit undesirable. In order to integrate separate RF circuit 55 along with CMOS chip 52, greater amounts of space on the PCB will be required, thereby forcing portable electronics (e.g., cellular phones) to be packaged in larger housings.

In view of the foregoing, there is a need for a circuit which integrates an RF circuit with a CMOS chip which avoids the problems of the prior art. This new circuit should be easy to manufacture, maintain power and signal strength, avoid the use of prior art co-axial lines and come in a more space efficient package. Additionally, this circuit should be able to handle high speed applications, including RF and microwave applications.

SUMMARY OF THE INVENTION

Broadly speaking, the present invention fills these needs by providing a circuit which integrates CMOS lines and RF lines, and methods for making the integrated circuit. It should be appreciated that the present invention can be implemented in numerous ways, including as a process, an apparatus, a system, a device, or a method. Several inventive embodiments of the present invention are described below.

In one embodiment, a method for making an integrated chip with CMOS lines and RF lines is disclosed. The method includes forming a lower metallization layer and then forming a lower dielectric layer over the lower metallization layer. After forming the lower dielectric layer, a metallization line is formed over the lower dielectric layer. An upper dielectric layer is then formed over the metallization line, with an upper metallization layer formed over the upper dielectric layer. Next, oxide spacers are formed along the sides of the lower and upper dielectric layers, the metallization line and the upper metallization layer. Finally, an encapsulating metal layer is deposited over the oxide spacers such that the lower metallization layer, the upper metallization layer and the encapsulating metallization layer define an outer shield of an RF line and the metallization line defines an inner conductor of the same RF line.

In another embodiment, a semiconductor device with CMOS circuitry and RF circuitry fabricated over a substrate is disclosed. The semiconductor device includes a lower metallization layer and a lower dielectric layer disposed over the lower metallization layer. A metallization line is then defined on the lower dielectric layer. An upper dielectric layer is disposed over the metallization line with an upper metallization layer disposed over the upper dielectric layer. Oxide spacers are defined along the sides of the lower and upper dielectric layers, the upper metallization layer and the metallization line. An encapsulating layer is configured to surround the oxide spacers such that the lower metallization layer, the upper metallization layer and the encapsulating layer define an outer shield of an RF line. The metallization line defines an inner conductor of the same RF line.

In yet another embodiment, a method for fabrication of a semiconductor device with CMOS circuitry and RF circuitry fabricated over a substrate is disclosed. A lower conductive shield is formed and a lower dielectric layer is formed within the shield. Once the lower dielectric layer is formed, a center conductor is formed over the lower dielectric layer. An upper dielectric layer is subsequently formed over the center conductor with an upper conductive shield over the upper dielectric layer. Thereafter, the upper dielectric layer is joined with the lower dielectric layer, such that the upper dielectric layer is in dielectric communication with the lower dielectric layer. Finally, the upper conductive shield is joined with the lower conductive shield such that an outer shield is formed which encapsulates the upper and lower dielectric layers and the center conductor, whereby the RF line is integrated with CMOS interconnect lines.

In another embodiment, a method for fabricating a semiconductor device with CMOS circuitry and RF circuitry fabricated over a substrate is disclosed. A first layer of titanium nitride is deposited and subsequently patterned. A first thin layer of oxide is then deposited over the first layer of titanium nitride. After the first thin layer of oxide is deposited, metal is sputtered over the thin layer to form a metallization layer. Upon forming the metallization layer, a second thin layer of oxide is deposited over the metallization layer. Once the second thin layer of oxide is deposited, a second layer of titanium nitride is formed over the second thin layer of oxide. An etch operation is then performed on the second layer of titanium nitride, the second thin layer of oxide, the metal, and the first thin layer of oxide. Next, a blanket of oxide is deposited over the second titanium nitride layer and the first titanium nitride layer. The blanket of oxide is subsequently etched to define oxide spacers. After the etch operation is complete, a blanket of titanium nitride is deposited over the first and second layers of titanium nitride and the oxide spacers. Finally, the blanket of titanium nitride is etched to cover the oxide spacers.

The many advantages of the present invention should be recognized. A semiconductor application can now integrate RF features and standard CMOS features on a single chip, and the RF features can be integrated on any level of a chip's interconnect region. As such, designers are no longer required to design and fabricate separate RF chips and CMOS chips to make a desired integrated circuit application. As a further advantage, there is no power and signal losses due to separate chip integration, increased fabrication time and costs, and the need for larger silicon area to design simple or complex circuits. Also, the present invention has the ability to handle a variety of high speed applications, such as RF, microwave and other applications running at frequencies up to and greater than 1 GHz. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

A semiconductor device with integrated CMOS circuitry and RF circuitry is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
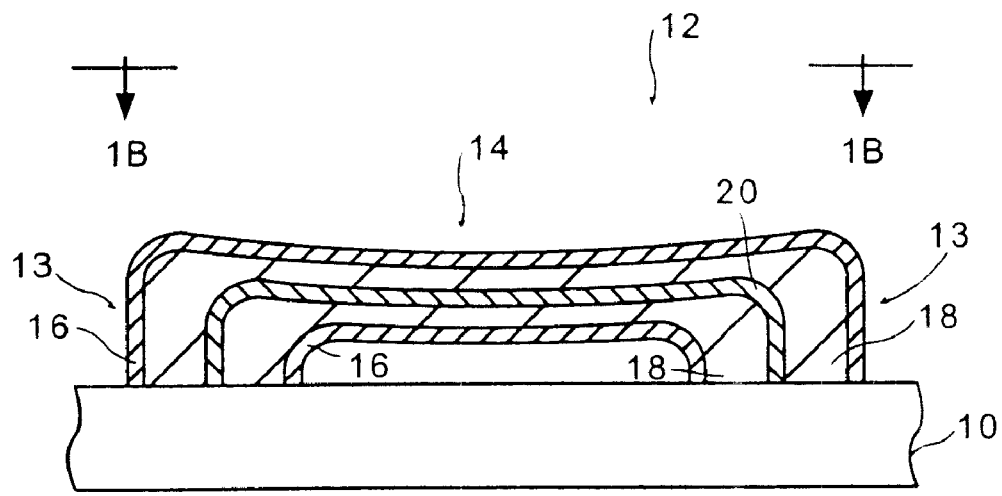
FIG. 1A depicts a cross-sectional view of a prior art interconnect structure.
Figure 1B:
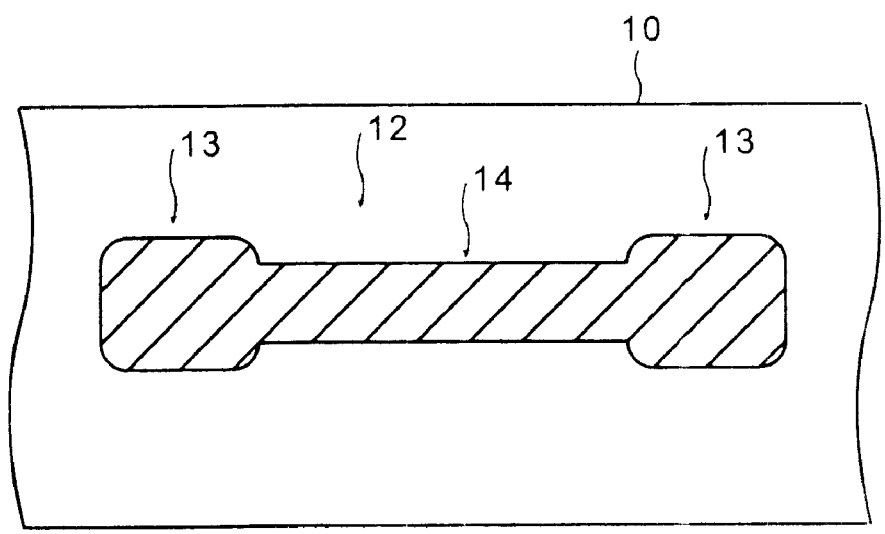
FIG. 1B represents a top view of the prior art interconnect structure.
Figure 1C:
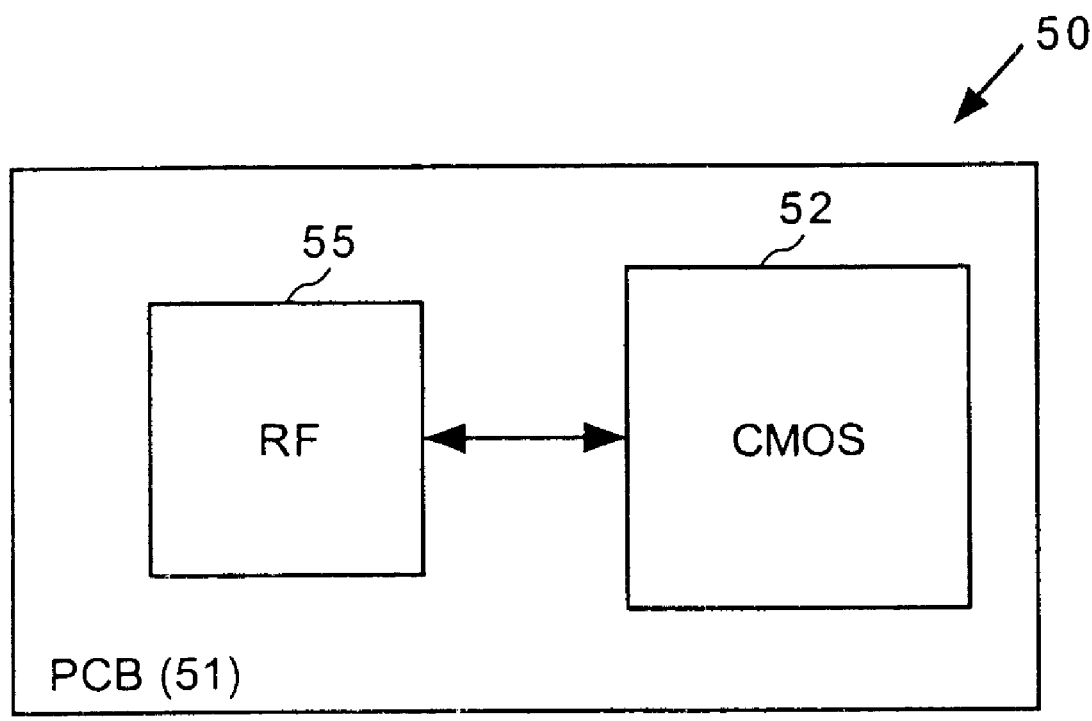
FIG. 1C is a top view of a prior art implementation using a separate RF chip and CMOS chip.
Figure 2A:
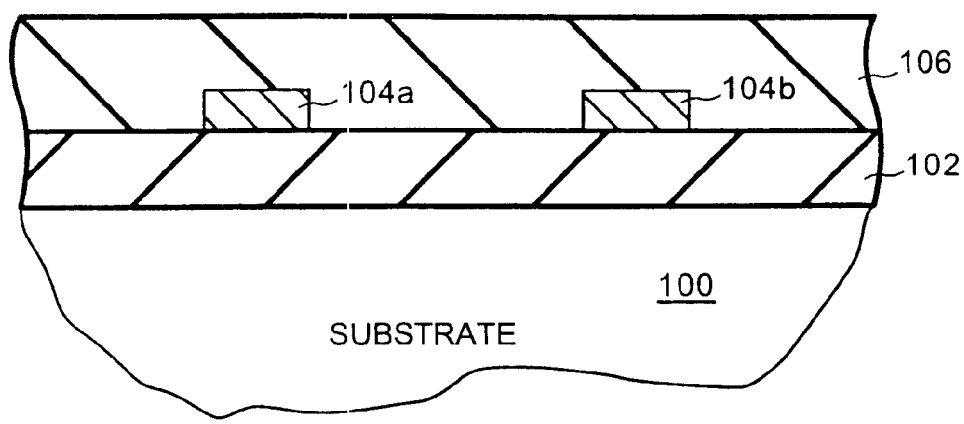
FIG. 2A is a cross-sectional view of a semiconductor substrate with multiple dielectric layers and conductive elements.

In FIG. 2A, a cross-sectional view of a semiconductor substrate 100 is shown. A dielectric layer 102 is formed over the semiconductor substrate 100, which typically has active transistor devices (not shown). Metallization lines 104a and 104b are formed over the dielectric layer 102, and a dielectric layer 106 is formed over the metallization lines 104a and 104b. As is well known, the metallization lines 104a and 104b can be interconnected with other standard CMOS circuitry throughout the first metallization layer 104. Metallization lines 104 are preferably about 5000 Angstroms thick and dielectric layer 106 is preferably about 11,000

Figure 2B:
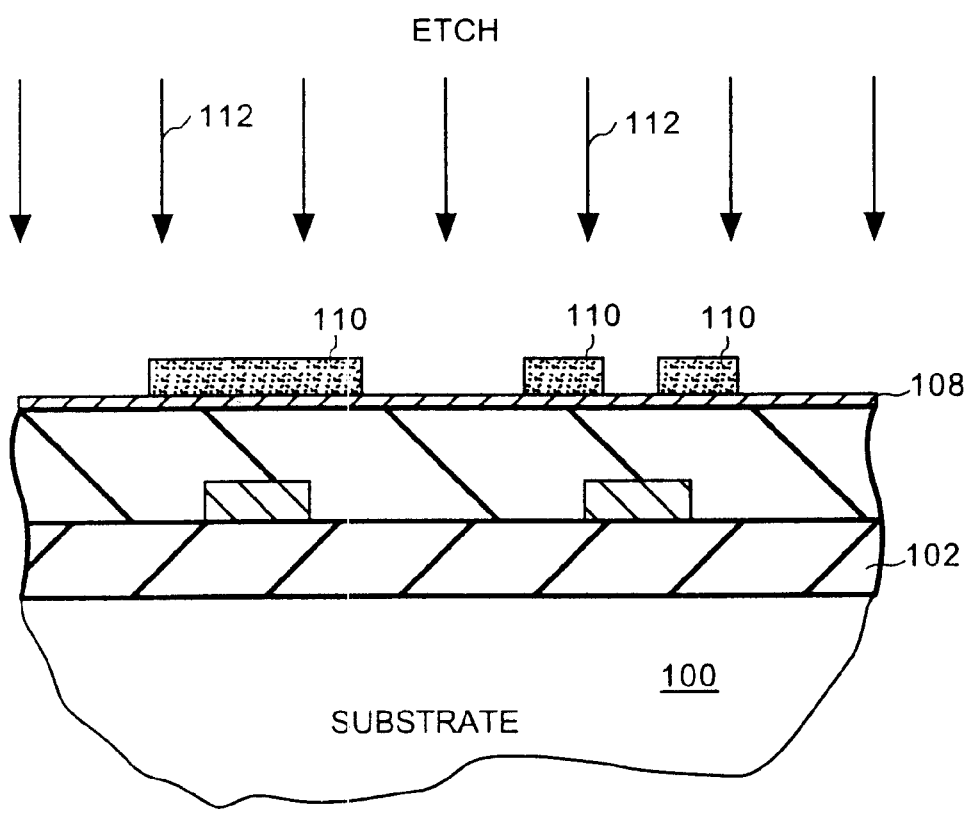
FIG. 2B illustrates the formation of a lower metallization layer over the dielectric layers and metallization lines.

Angstroms thick. Dielectric layers 102 and 106 are formed by standard deposition techniques and may be defined by standard dielectric materials, such as silicon dioxide (SiO₂). FIG. 2B illustrates the formation of a lower metallization layer 108, from which an RF line will ultimately be constructed. Lower metallization layer 108 is deposited over dielectric layer 106. Lower metallization layer 108 is preferably titanium nitride (TiN). However, other suitable conductive materials, such as titanium tungsten (TiW), tungsten (W) and tantalum (Ta) can also be used. Preferably, the lower metallization layer 108 is deposited to a thickness ranging between about 200 Angstroms and about 2,000 Angstroms, and more preferably between about 300 Angstroms and about 1,000. Angstroms, and most preferably about 500 Angstroms.

A photoresist mask 110 is then formed over metallization layer 108 using standard photolithography techniques. Once photoresist mask 110 is defined over metallization layer 108, an etch operation 112 is performed to pattern the lower metallization layer 108. The etch operation 112 is preferably configured to etch metal materials, such as TiN, and the etching is preferably performed in a plasma etch chamber. In one embodiment, the etch chamber is a Lam Research TCP 9600SE™ chamber, and is available from Lam Research Corporation of Fremont, Calif. For more information on one exemplary etch operation 112, reference can be made to Table A below.

TABLE A

|  | Endpoint Overetch | | | | | |
| --- | --- | --- | --- | --- | --- | --- |
|  | Step 01 | Step 02 | Step 03 | Step 04 | Step 05 | Step 06 |
| Pressure (mT) | 90.00 | 10.00 | 10.00 | 10.00 | 90.00 | 0.00 |
| RF-Top (W) | 0 | 0 | 450 | 450 | 0 | 0 |
| RF-Bottom (W) | 0 | 0 | 135 | 135 | 0 | 0 |
| Gap (cm) | N/A | N/A | N/A | N/A | N/A | N/A |
| BCl3 (sccm) | 0.0 | 60.0 | 60.0 | 60.0 | 0.0 | 0.0 |
| Cl2 (sccm) | 0.0 | 60.0 | 60.0 | 60.0 | 0.0 | 0.0 |
| N2 (sccm) | 0.0 | 11.0 | 11.0 | 11.0 | 0.0 | 0.0 |
| He clamp (T) | 0.0 | 10.0 | 10.0 | 10.0 | 0.0 | 0.0 |
| Completion | Time | Stabl | EndPt | Overetch | Time | End |
| Time | 10 s | 30 s | 25 | 30% | 10 s | s |
| Channel |  |  | A |  |  |  |
| Delay (sec) |  |  | 8 |  |  |  |
| Norm (sec) |  |  | 2 |  |  |  |
| Norm value |  |  | 0 |  |  |  |
| Trigger (%) |  |  | 90 |  |  |  |

Figure 2C:
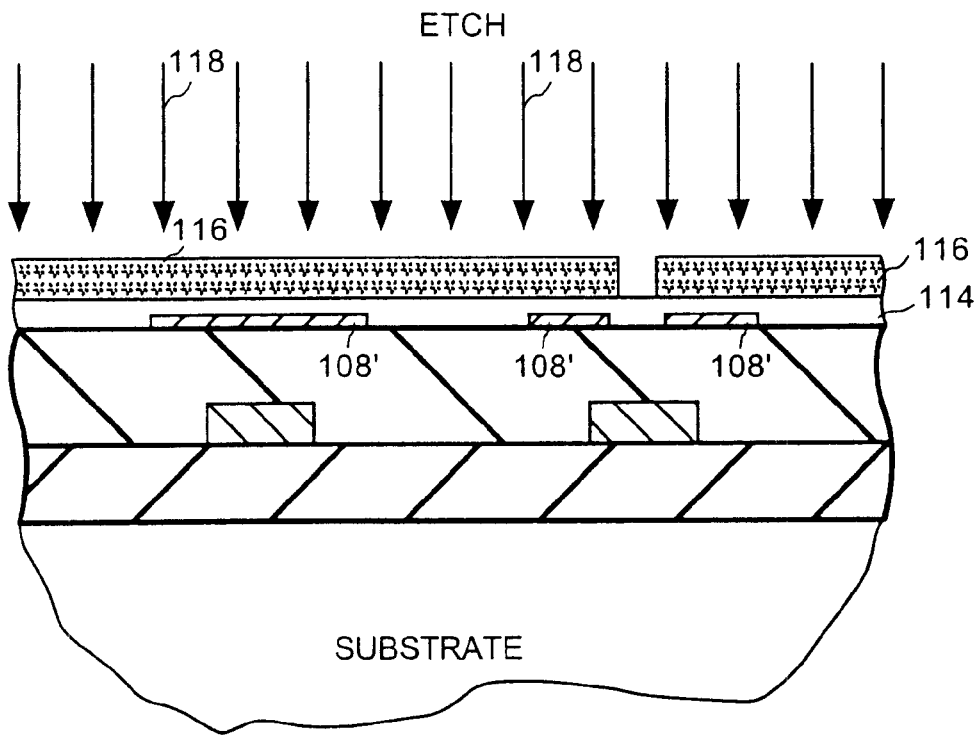
FIG. 2C demonstrates the formation of a lower dielectric layer over an etched metallization layer.

Etch operation 112 forms lower metallization layer 108' as shown in FIG. 2C. FIG. 2C illustrates the formation of a lower dielectric layer 114, which is a thin oxide layer. The lower dielectric layer 114 forms part of the dielectric material of an RF line. The lower dielectric layer 114 is deposited over patterned lower metallization layer 108'. Lower dielectric layer 114 is preferably silicon dioxide (SiO₂). In this embodiment, the lower dielectric layer 114 is deposited to a thickness ranging between about 500 Angstroms and about 5000 Angstroms, and most preferably about 1000 Angstroms.

Figure 2D:
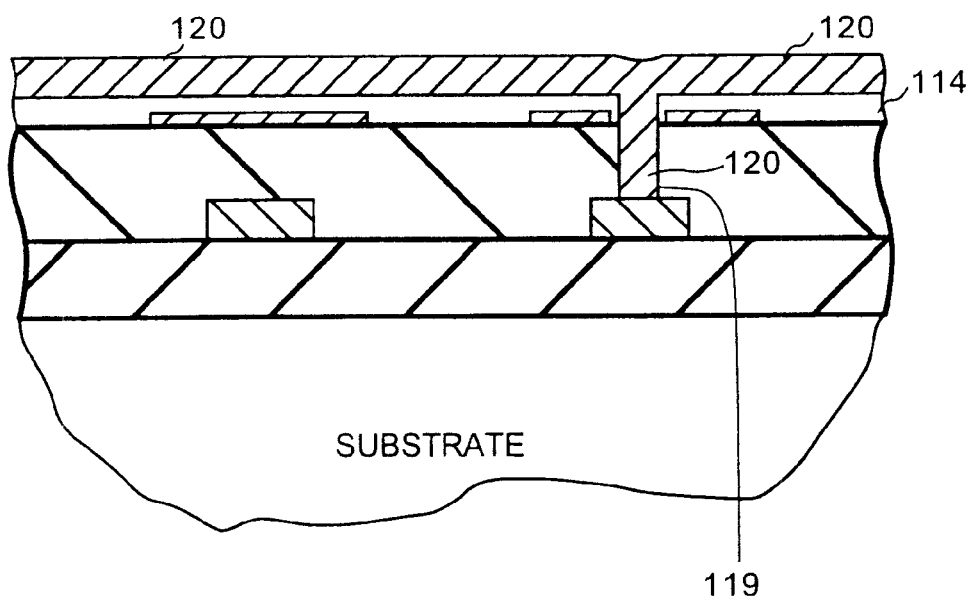
FIG. 2D shows the formation of a tungsten layer plug in a via.

A photoresist mask 116 is then formed over lower dielectric layer 114 using standard photolithography techniques. Once photoresist mask 116 is defined over lower dielectric layer 114, a dielectric etch operation 118 is performed to pattern lower dielectric layer 114. In this example, the patterning is configured to define a via hole, which is shown in FIG. 2D. The etch operation 118 is preferably well suited to etch dielectrics, such as SiO₂.

Etch operation 118 forms via 119 as shown in FIG. 2D. FIG. 2D illustrates the formation of a tungsten (W) layer plug 120 in via 119. The tungsten layer 120 is deposited lower dielectric layer 114 and into via 119. In this embodiment, via 119 has a width of about 0.25 microns.

Figure 2E:
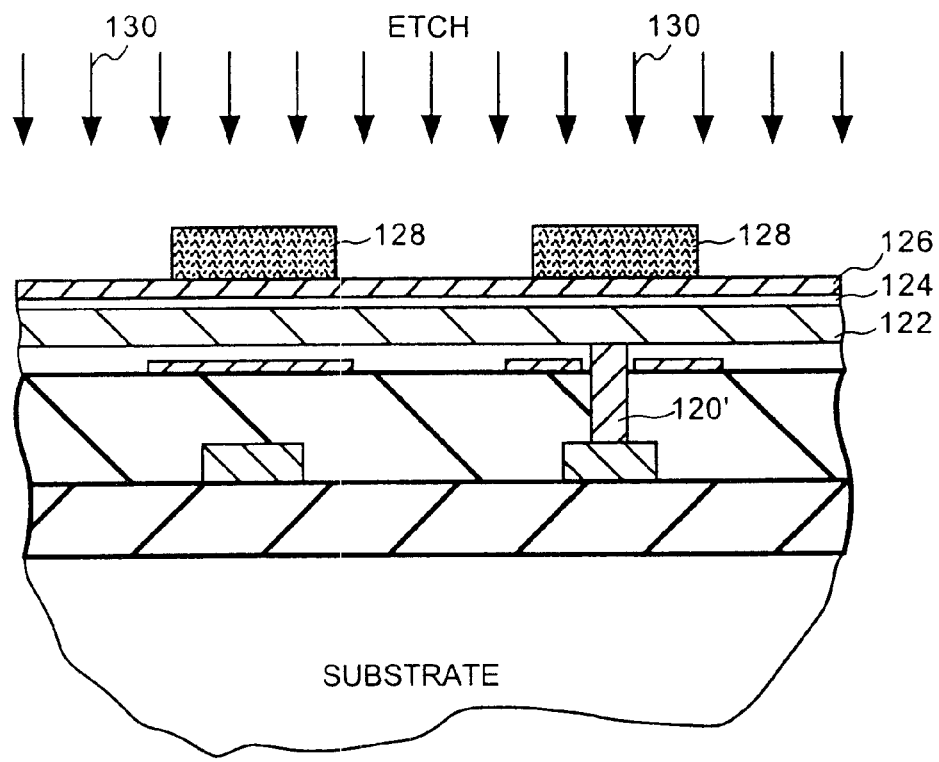
FIG. 2E is an illustration depicting an etching operation used to define a metallization line, an upper dielectric layer and an upper metallization layer.

After deposition is complete, tungsten layer 120 is subjected to a standard chemical mechanical polishing (CMP) operation to remove the portion of tungsten layer 120 lying on dielectric layer 114. Once the CMP operation is complete, tungsten plug 120' is formed, as shown in FIG. 2E. The tungsten (W) plug 120' can provide electrical communication between metallization line 104 and an RF line (shown complete in FIG. 2H). The via 119 may also may be lined with a metal glue layer (not shown) to promote good electrical contact.

FIG. 2E is an illustration depicting the etching operation used to define the metallization line 122, upper dielectric layer 124 and upper metallization layer 126. Metallization line 122 is formed over lower dielectric layer 114. Metallization line 122 is preferably aluminum having a small content of copper (e.g., AlCu). In one embodiment, the metallization line 122 has a center region that is AlCu and is sandwiched between two thin layers of TiN. For simplicity, the metallization line 122 will not pictorially illustrate the TiN layers. Metallization line is preferably about 5000 Angstroms in thickness.

Upper dielectric layer 124 is deposited over metallization line 122. Upper metallization layer 126 is then formed over the upper dielectric layer 124. Preferably, the upper metallization layer 126 is TiN and the upper dielectric layer is silicon dioxide. Upper metallization layer may also be, for example, titanium tungsten (TiW), tungsten (W) and tantalum (Ta). In this embodiment, upper dielectric layer is about 500 Angstroms to about 5000 Angstroms, and more preferably about 1000 Angstroms. In addition, upper metallization layer 126 is preferably between about 400 Angstroms and about 4000 Angstroms, and more preferably between about 600 Angstroms and about 2000 Angstroms and most preferably about 1000 Angstroms.

A photoresist mask 128 is then formed over upper metallization layer 126 using standard photolithography techniques. Once photoresist mask 128 is defined over metallization layer 126, an etch operation 130 is performed to pattern upper metallization layer 126, upper dielectric layer 124, and metallization line 122. The etch operation 130 will preferably etch metallization layer 126, upper dielectric layer 124, metallization line 122 and lower dielectric layer 114 to width between about 0.25 microns and about 100 microns, and more preferably between about 5000 Angstroms and about 10 microns, and most preferably about 8000 Angstroms. The etch operation 130 is preferably a plasma etch operation performed in an etch chamber. In one embodiment, the etch chamber is a Lam Research TCP 9600™ chamber. For more information on one exemplary etch process 130, reference can be made to Table B below.

TABLE B

|  | Step 01 | Step 02 | TiN Step 03 | Step 04 | Oxide Step 05 | Step 06 | TiN Step 07 | AlCu Step 08 | TiN Step 09 | Step 10 | Oxide Step 11 | Step 12 | Step 13 |
|---|---|---|---|---|---|---|---|---|---|---|---|---|---|
| Pressure (mT) | 90.00 | 10.00 | 10.00 | 30.00 | 30.00 | 10.00 | 10.00 | 10.00 | 10.00 | 30.00 | 30.00 | 90.00 | 0.00 |
| RF-Top (W) | 0 | 0 | 450 | 0 | 450 | 0 | 450 | 450 | 450 | 0 | 450 | 0 | 0 |
| RF-Bottom (W) | 0 | 0 | 135 | 0 | 300 | 0 | 135 | 300 | 135 | 0 | 300 | 0 | 0 |
| BCl3 (sccm) | 0.0 | 60.0 | 60.0 | 0.0 | 0.0 | 60.0 | 60.0 | 60.0 | 75.0 | 0.0 | 0.0 | 0.0 | 0.0 |
| Cl2 (sccm) | 0.0 | 60.0 | 60.0 | 0.0 | 0.0 | 60.0 | 60.0 | 60.0 | 45.0 | 0.0 | 0.0 | 0.0 | 0.0 |
| N2 (sccm) | 0.0 | 11.0 | 11.0 | 0.0 | 0.0 | 11.0 | 11.0 | 11.0 | 0.0 | 0.0 | 0.0 | 0.0 | 0.0 |
| CF4 (sccm) | 0.0 | 0.0 | 0.0 | 30.0 | 30.0 | 0.0 | 0.0 | 0.0 | 0.0 | 30.0 | 30.0 | 0.0 | 0.0 |
| Ar (sccm) | 0.0 | 0.0 | 0.0 | 100.0 | 100.0 | 0.0 | 0.0 | 0.0 | 0.0 | 100.0 | 100.0 | 0.0 | 0.0 |
| CHF3 (sccm) | 0.0 | 0.0 | 0.0 | 90.0 | 90.0 | 0.0 | 0.0 | 0.0 | 0.0 | 90.0 | 90.0 | 0.0 | 0.0 |
| He clamp (T) | 0.0 | 10.0 | 10.0 | 10.0 | 10.0 | 10.0 | 10.0 | 10.0 | 10.0 | 10.0 | 10.0 | 0.0 | 0.0 |
| Completion | Time | Stabl | Time | Stabl | Time | Stabl | Time | EndPt | Time | Stabl | Time | Time | End |
| Time | 10 s | 30 s | 20 s | 30 s | 20 s | 30 s | 10 s | 125 s | 45 s | 30 s | 20 s | 10 s | s |
| Channel |  |  |  |  |  |  |  | A |  |  |  |  |  |
| Delay (sec) |  |  |  |  |  |  |  | 35 |  |  |  |  |  |
| Norm (sec) |  |  |  |  |  |  |  | 5 |  |  |  |  |  |
| Norm value |  |  |  |  |  |  |  | 0 |  |  |  |  |  |
| Trigger (%) |  |  |  |  |  |  |  | 110 |  |  |  |  |  |

Figure 2F:
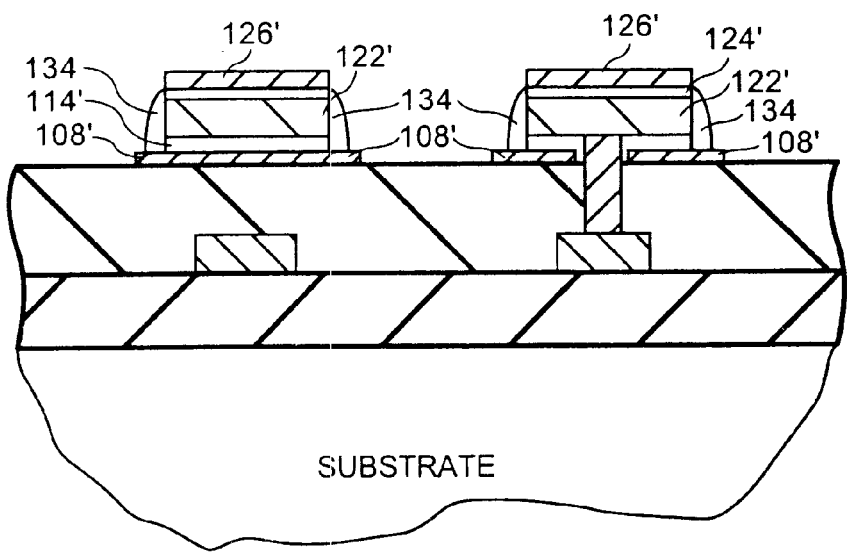
FIG. 2F depicts an upper metallization line, an upper dielectric layer, a metallization line and a lower dielectric layer after etching, in addition to showing oxide spacers.

Once etch operation 130 is complete, upper metallization layer 126', upper dielectric layer 124', metallization line 122' and lower dielectric layer 114' are formed, as shown in FIG. 2F. Additionally, after etch operation 130 is complete, an oxide layer (not shown) is blanket deposited over the upper metallization layer 126', lower metallization layer 108' and dielectric layer 106. The oxide layer is then subjected to an oxide etch operation (not shown) to form oxide spacers 134. The oxide spacers 134 are formed on top of lower metallization layer 108' and along the side walls of lower dielectric layer 114', metallization line 122' and upper dielectric layer 124'. The oxide spacers are preferably between about 500 Angstroms and about 5000 Angstroms, and more preferably about 1000 Angstroms. The exemplary etch recipe for forming the spacers 134 is shown in Table C below.

TABLE C

|  | Step 1 | Step 2 | Step 3 | Step 4 | Step 5 | Step 6 | Step 7 | Step 8 |
|---|---|---|---|---|---|---|---|---|
| Pressure (mT) | 500 | 200 | 200 | 200 | 200 | 300 | 300 | 300 |
| RF (W) | 0 | 0 | 590 | 1180 | 1180 | 0 | 0 | 0 |
| LoFAT Tap | 3 | 3 | 3 | 3 | 3 | 0 | 0 | 0 |
| ESC (V) | 2000 | 400 | 400 | 400 | 400 | -1 | -2000 | 0 |
| Gap (cm) | 1.05 | 1.05 | 1.05 | 1.05 | 1.05 | 5.53 | 5.53 | 5.53 |
| Ar (sccm) | 200 | 400 | 400 | 400 | 400 | 100 | 100 | 100 |
| CF$_4$ (sccm) | 0 | 30 | 30 | 30 | 30 | 0 | 0 | 0 |
| CHF$_3$ (sccm) | 0 | 90 | 90 | 90 | 90 | 0 | 0 | 0 |
| He Clamp (T) | 0 | 10 | 10 | 10 | 10 | 0 | 0 | 0 |
| Lifter Pos | Down | Down | Down | Down | Down | Down | Down | Up |
| Completion | Time | Stabl | Time | Endpt | OEtch | Time | Time | End |
| Time (sec) | 4 | 30 | 2 | 23 | 10% | 2 | 6 | 30 |
| Channel |  |  |  | D |  |  |  |  |
| Delay (sec) |  |  |  | 11 |  |  |  |  |
| Norm (sec) |  |  |  | 4 |  |  |  |  |
| Trigger |  |  |  | 90% |  |  |  |  | etch chamber. In one embodiment, the etch chamber is a Lam Research TCP 9600SE™ chamber. The exemplary etch recipe for etching the metallization layer 126 is shown in Table D below.

TABLE D

|  | Step 01 | Step 02 | Step 03 | Step 06 | Step 07 | Step 08 |
|---|---|---|---|---|---|---|
| Pressure (mT) | 90.00 | 10.00 | 10.00 | 10.00 | 90.00 | 0.00 |
| RF-Top (W) | 0 | 0 | 450 | 450 | 0 | 0 |
| RF-Bottom (W) | 0 | 0 | 135 | 135 | 0 | 0 |
| BCl3 (sccm) | 0.0 | 60.0 | 60.0 | 75.0 | 0.0 | 0.0 |
| Cl2 (sccm) | 0.0 | 60.0 | 60.0 | 45.0 | 0.0 | 0.0 |

Figure 2G:
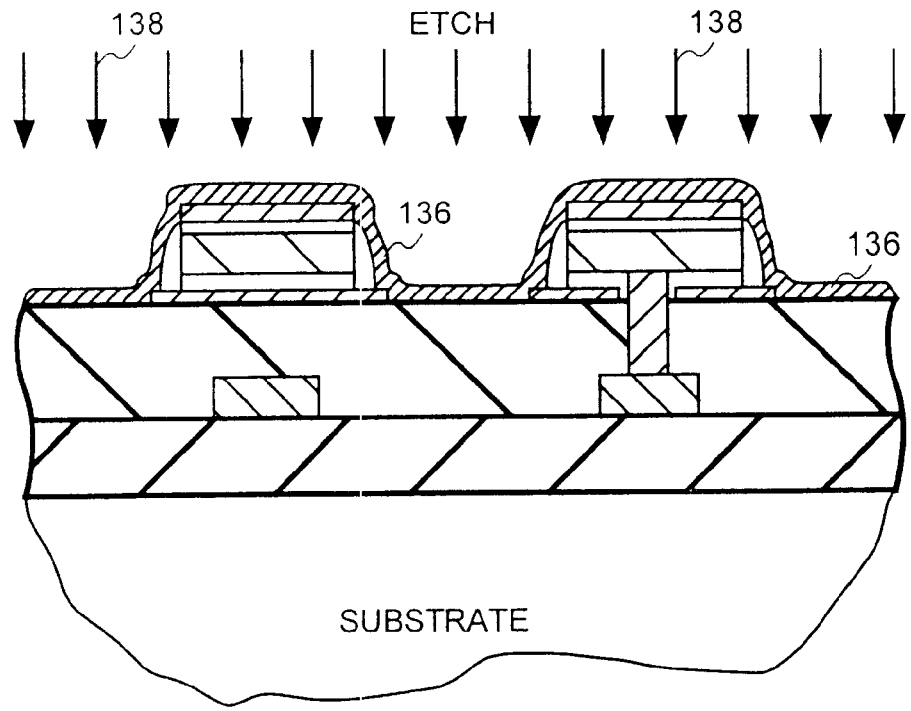
FIG. 2G illustrates the deposition of a metallization layer over an upper metallization layer, oxide spacers and a lower metallization layer.

FIG. 2G illustrates a metallization layer 136 that is deposited over the upper metallization layer 126', oxide spacers 134 and lower metallization layer 108'. Metallization layer 136 is preferably titanium nitride (TiN). Metallization layer 136 may also be, for example, titanium tungsten (TiW), tungsten (W) and tantalum (Ta). Also, metallization layer 136 is preferably a thickness between about 500 Angstroms and about 2000 Angstroms, and more preferably about 1000 Angstroms. After metallization layer 136 is formed, an etch operation 138 is performed on the metallization layer 136. The etch operation 138 is preferably configured to etch metal materials, such as TiN, and the etching operation 138 is preferably performed in a plasma TABLE D-continued

|  | Step 01 | Step 02 | Step 03 | Step 06 | Step 07 | Step 08 |
|---|---|---|---|---|---|---|
| N2 (sccm) | 0.0 | 11.0 | 11.0 | 0.0 | 0.0 | 0.0 |
| He clamp (T) | 0.0 | 10.0 | 10.0 | 10.0 | 0.0 | 0.0 |
| Completion | Time | Stabl | EndPt | OEtch | Time | End |
| Time | 10 s | 30 s | 30 | 10% | 10 s | s |
| Channel |  |  | A |  |  |  |
| Delay (sec) |  |  | 12 |  |  |  |
| Norm (sec) |  |  | 3 |  |  |  |

TABLE D-continued

| | Step 01 | Step 02 | Step 03 | Step 06 | Step 07 | Step 08 |
|---|---|---|---|---|---|---|
| Norm value | | | 0 | | | |
| Trigger (%) | | | 95 | | | |

Figure 2H:
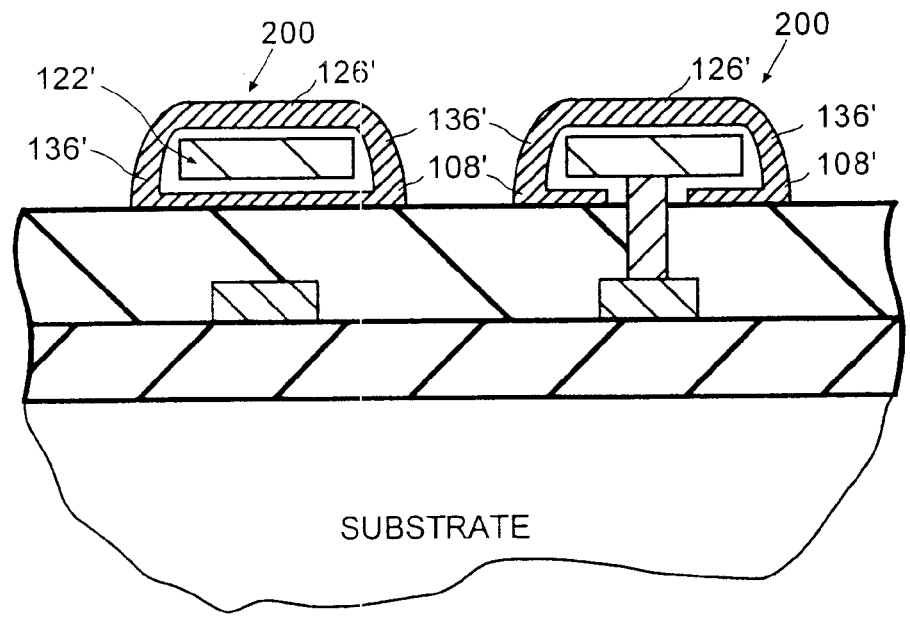
FIG. 2H illustrates an RF line made in accordance with one embodiment of this invention.

After etch operation 138 is finished, resulting RF lines 200 are defined, as shown in FIG. 2H. Each of the RF lines 200 is bounded by an outer shield defined by lower metallization layer 108', metallization layer 136', and upper metallization layer 126', as shown in FIG. 2H. This shield defines an outer conductor, and the metallization line 122' defines an inner conductor of a coaxial-type line. The metallization layer 136' is preferably between about 200 Angstroms and about 2000 Angstroms, and more preferably between about 300 Angstroms and about 1000 Angstroms and most preferably about 500 Angstroms.

It should be noted that the RF line was fabricated using standard CMOS circuitry-type fabrication operations, and the RF line can be interconnected to other CMOS lines, such as metallization line 104b. When the connection to the metallization line 104b is made, the tungsten plug 120' will define the electrical connection. Further, as will be described with reference to FIG. 5, the RF lines can be fabricated on any level of the device. This is advantageous over the prior art, which only allowed fabrication of RF-type features on the upper most level.

Figure 3:
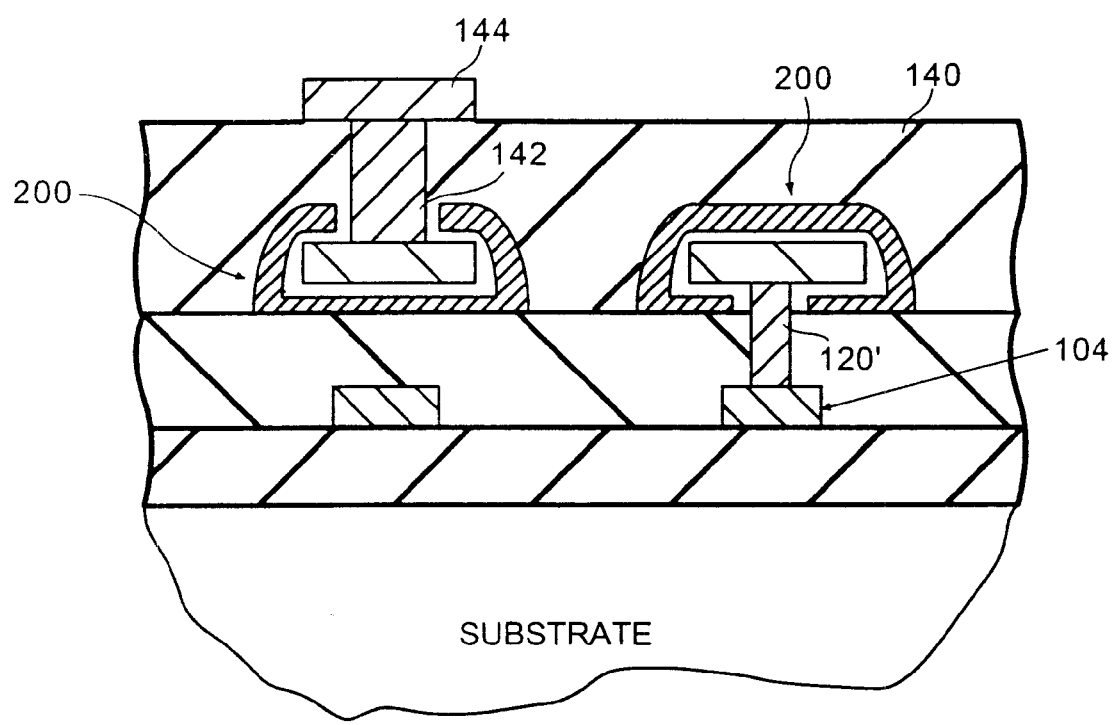
FIG. 3 depicts a semiconductor device with an integrated CMOS metallization line and coaxial RF lines in accordance with another embodiment of this invention.

FIG. 3 depicts another embodiment for a semiconductor device with an integrated CMOS metallization line 144 and coaxial RF lines 200. As illustrated, RF lines 200 have tungsten plugs 142 and 120' interconnecting CMOS metallization line 144 on the metal layer above RF line 200 and CMOS metallization line 104 on the metal layer below RF line 200. This embodiment of the current invention may be fabricated using the techniques mentioned previously with reference to FIGS. 2A–2H. It should be noted that the RF lines 200 can therefore make electrical connections to standard CMOS lines that are fabricated on levels below and above respective RF lines 200. Furthermore, although the RF lines 200 are shown fabricated on the same level, it should be understood that the RF lines can be integrated into any level of the interconnect region, as will be illustrated below in FIG. 5.

Figure 4:
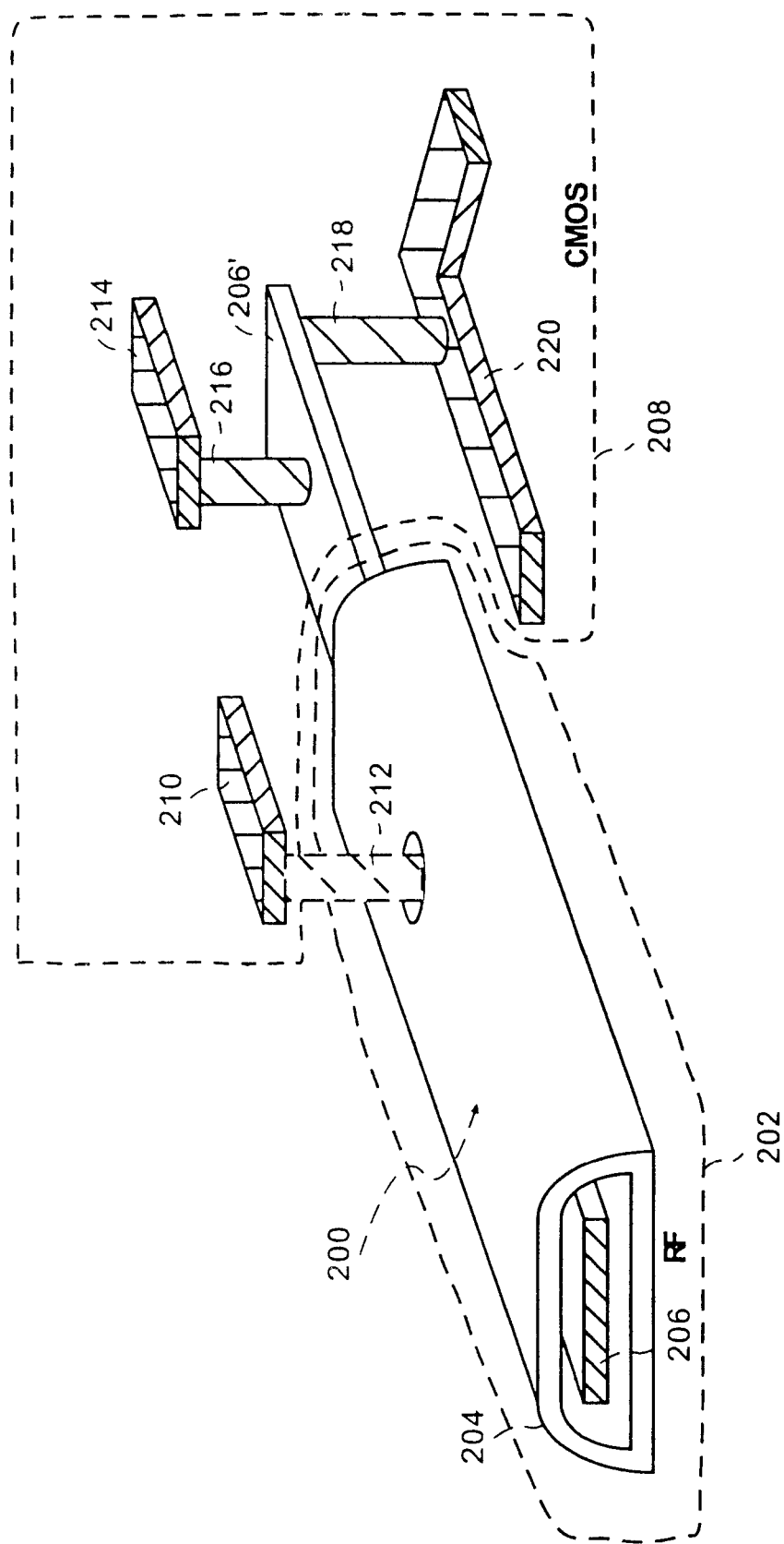
FIG. 4 is a perspective view of an embodiment of the claimed invention showing RF circuitry integrated with CMOS circuitry.

FIG. 4 is a perspective view of an embodiment of the claimed invention. FIG. 4 depicts RF circuitry 202 being in electrical communication with CMOS circuitry 208. As shown, the center conductor 206 of co-axial RF line 200 extends from the rear of co-axial line 200 to form CMOS line extension 206'. CMOS extension line 206' electrically contacts CMOS lines 214 and 220 through conducting vias 216 and 218. RF line 200 is in electrical communication with CMOS lines 214, 220 and 206', all located on various metal layers of a semiconductor device. In addition, RF line 200 is in electrical communication with CMOS line 210. Center conductor 206 of RF line 200 connects with CMOS line 210 through via 212. More specifically, via 212 contacts center conductor 206 through a passageway in outer conductor 204, and is preferably fabricated as described with reference to FIGS. 2A–2H. Of course, other via fabrication techniques may also be used.

Figure 5:
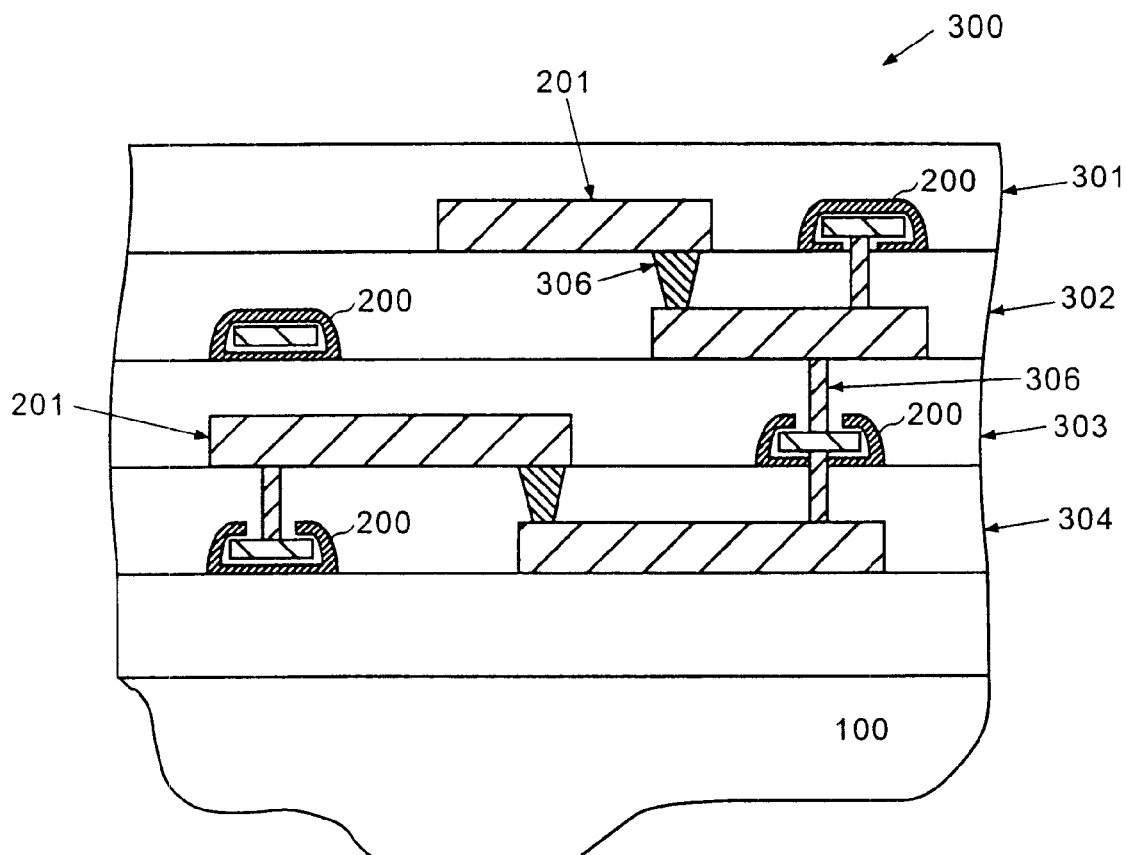
FIG. 5 is a cross-sectional view of a semi-conductor device integrating RF circuitry with CMOS circuitry in accordance with another embodiment of the present invention.

FIG. 5 is a cross-sectional view of semi-conductor device 300, in accordance with one embodiment of the present invention. Semiconductor device 300 contains metal layers 301, 302, 303, and 304. Metal layers 301, 302, 303 and 304 each contain RF lines 200 and CMOS lines 201. As shown, RF co-axial lines 200 are interspersed throughout the various metal layers in semiconductor device 300. Conductive vias 306 provide electrical communication between RF lines 200. CMOS lines 201 as shown. It is now possible to integrate RF co-axial lines 200 throughout a semiconductor device, as opposed to the prior art, where it is was only possible to place an RF line at the top of a semiconductor device.

Figure 6:
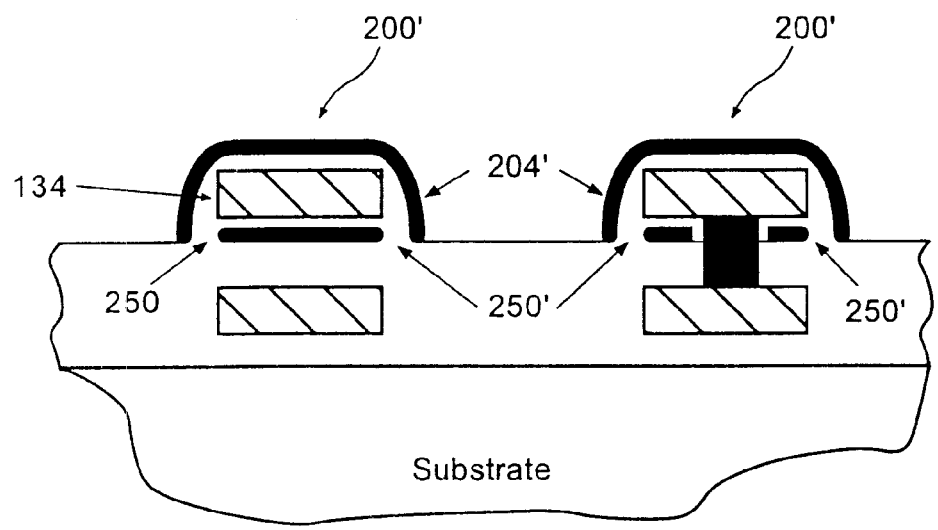
FIG. 6 shows an alternate embodiment of the present invention with integrated RF circuitry and CMOS circuitry.

FIG. 6 shows an alternate embodiment of the claimed invention. The outer shield 204' differentiates RF line 200' from RF line 200. In RF line 200, outer shield 204 completely encloses RF line 200. As described above, for RF line 200, the only openings defined in outer shield 204 are those that allow electrical access for conductive vias. In FIG. 6, outer shield 204' does not completely encapsulate RF line 200'. Instead, outer shield 204' has gaps 250' located at the lower portion of oxide spacer 134. RF lines 200' are constructed using the same standard CMOS fabrication technique for RF lines 200, however, the photoresist mask 110 is modified such that only a bloated via is etched into the lower metallization layer 108 (e.g., the TiN layer). In addition, the etch operation 130 will be configured to etch all the way down and through the lower metallization layer 108.

It should be appreciated that the process operations used to form RF lines 200' are more streamlined, and therefore, they require fewer process operations. Although RF lines 200' work well, they may be prone power leakage. Accordingly, the RF lines 200 are more preferred when an integrated circuit application is sensitive to power loss.

In either case, it should be appreciated that the embodiments of the present invention allow compact integration of both CMOS circuitry and RF circuitry on a single chip. This has the advantage of allowing the fabrication of an entire system-on-a-chip. As mentioned above, the ability to build system-on-a-chip devices that incorporate both CMOS circuitry and RF circuitry enables designers to make smaller, lighter and less expensive consumer electronics. In particular, such electronics may include cellular phones and wireless communication electronics. Additionally, the present invention may also be implemented to carry out the functionality of high speed applications other than RF, such as microwave circuit applications.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A semiconductor device with CMOS circuitry and RF circuitry fabricated over a substrate comprising:

a lower metallization layer, a lower dielectric layer disposed over the lower metallization layer;

a metallization line disposed over the lower dielectric layer;

an upper dielectric layer disposed over the metallization line;

an upper metallization layer disposed over the upper dielectric layer;

oxide spacers disposed along sides of the lower and upper dielectric layers and the metallization line;

an encapsulating metallization layer surrounding the oxide spacers such that the lower metallization layer, the upper metallization layer and the encapsulating metallization layer define an outer shield of an RF line and the metallization line defines an inner conductor of the RF line; and a conductive via defined through the outer shield and electrically isolated from the outer shield.

2. A semiconductor device with CMOS circuitry and RF circuitry fabricated over a substrate according to claim 1, further comprising:

a CMOS interconnect line on a level other than the RF line such that said CMOS interconnect is in electrical communication with said metallization line of said RF line.

3. A semiconductor device with CMOS circuitry and RF circuitry fabricated over a substrate according to claim 2, wherein the conductive via connects the CMOS interconnect line to the metallization line of said RF line.

4. A semiconductor device with CMOS circuitry and RF circuitry fabricated over a substrate, comprising:

a lower metallization layer;

a lower dielectric layer disposed over the lower metallization layer;

a metallization line disposed over the lower dielectric layer;

an upper dielectric layer disposed over the metallization line;

an upper metallization layer disposed over the upper dielectric layer;

oxide spacers disposed along sides of the lower and upper dielectric layers and the metallization line; and an encapsulating metallization layer surrounding the oxide spacers such that the lower metallization layer, the upper metallization layer and the encapsulating metallization layer define an outer shield of an RF line and the metallization line defines an inner conductor of the RF line;

wherein the inner conductor extends beyond the outer shield such that the inner conductor is external to an outer conductor and forms a CMOS line extension integral with the RF line.

5. A semiconductor device with CMOS circuitry and RF circuitry fabricated over a substrate according to claim 4, wherein the CMOS line extension interconnects with a network of CMOS circuitry.

* * * * *